(12) United States Patent
Orimoto (10) Patent No.: US 8,786,107 B2
(45) Date of Patent: Jul. 22, 2014

(54) SEMICONDUCTOR MODULE (75) Inventor: Norimune Orimoto, Toyota (JP)

(73) Assignee: Toyota Jidosha Kabushiki Kaisha, Toyota-Shi (JP)

(*) Notice: Subject to any disclaimer, the term of this patent is extended or adjusted under 35 U.S.C. 154(b) by 0 days.

(21) Appl. No.: 13/613,646

(22) Filed: Sep. 13, 2012

(65) Prior Publication Data

US 2013/0093095 A1    Apr. 18, 2013

Related U.S. Application Data

(63) Continuation of application No. PCT/JP2011/073563, filed on Oct. 13, 2011.

(51) Int. Cl.
*H01L 29/40* (2006.01)
*H01L 23/48* (2006.01)

(52) U.S. Cl.
USPC ........... 257/785; 257/688; 257/704; 257/710; 257/727

(58) Field of Classification Search
USPC ............ 257/688–699, 710, E23.18, E23.181, 257/E23.183–E23.187, 704, 785
See application file for complete search history.

(56) References Cited

U.S. PATENT DOCUMENTS

| | | | | |
|---|---|---|---|---|
| 1,341,771 A | * | 6/1920 | Allender | 24/662 |
| 3,025,435 A | * | 3/1962 | Green | 257/785 |
| 3,155,885 A | * | 11/1964 | Marino et al. | 257/727 |
| 3,252,060 A | * | 5/1966 | Krawczykiewicz et al. | 257/727 |
| 3,480,844 A | * | 11/1969 | Lewis | 257/785 |
| 4,624,303 A | * | 11/1986 | Nippert | 257/E23.193 |
| 5,866,944 A | * | 2/1999 | Hiyoshi et al. | 257/727 |
| 6,380,622 B1 | | 4/2002 | Hirai et al. | |
| 7,423,334 B2 | * | 9/2008 | Tu et al. | 257/E23.193 |
| 7,534,979 B2 | * | 5/2009 | Ito et al. | 257/727 |
| 8,581,422 B2 | * | 11/2013 | Aoshima | 257/785 |

(Continued)

FOREIGN PATENT DOCUMENTS

| | | |
|---|---|---|
| JP | 2-15643 A | 1/1990 |
| JP | 9-252067 A | 9/1997 |

(Continued)

OTHER PUBLICATIONS http://www.denso.co.jp/ja/news/newsreleases/2007/070523-01.html, News Release of DENSO Corporaton, May 23, 2007.

(Continued)

*Primary Examiner* — Fernando L Toledo
*Assistant Examiner* — Christine C Lau
(74) *Attorney, Agent, or Firm* — Kenyon & Kenyon LLP (57) ABSTRACT

A semiconductor module includes a semiconductor having a semiconductor substrate, a first electrode formed on one surface of the semiconductor substrate, and a second electrode formed on an opposite surface of the semiconductor substrate. A first conductive member is in contact with the first electrode. A second conductive member is in contact with the second electrode. A third conductive member is in contact with the second conductive member and extends along the first conductive member. An insulating member provides insulation between the first conductive member and the third conductive member. The third conductive member is fixed to the first conductive member and the second conductive member by being sandwiched between the first conductive member and the second conductive member. The semiconductor device is fixed to the first conductive member and the second conductive member by being sandwiched between the first conductive member and the second conductive member.

6 Claims, 6 Drawing Sheets

(56) References Cited

U.S. PATENT DOCUMENTS

| | | | |
|---|---|---|---|
| 8,653,643 B2* | 2/2014 | Orimoto | 257/688 |
| 8,659,150 B2* | 2/2014 | Imai | 257/727 |
| 2008/0054447 A1* | 3/2008 | Wu et al. | 257/704 |

FOREIGN PATENT DOCUMENTS

| | | | |
|---|---|---|---|
| JP | 2001-102400 A | 4/2001 | |
| JP | 2002-057263 A | 2/2002 | |
| JP | 2009-13800 A | 1/2009 | |

OTHER PUBLICATIONS

Notice of Allowance for U.S. Appl. No. 13/554,254 mailed on Sep. 4, 2013.

Notice of Allowance for U.S. Appl. No. 13/611,568 mailed on Jul. 9 2013.

* cited by examiner

SEMICONDUCTOR MODULE

CROSS-REFERENCE TO RELATED APPLICATIONS

This is a Continuation of International Application No. PCT/JP2011/073563 filed on Oct. 13, 2011, the disclosure of which is hereby incorporated by reference herein in its entirety.

TECHNICAL FIELD

The technique disclosed in the present description relates to a semiconductor module.

BACKGROUND ART

When a semiconductor device generates heat, the semiconductor device and peripheral members thereof (solder, wiring, and the like) thermally expand. Due to differences in coefficients of thermal expansion among the respective members, stress acts on the semiconductor device. Such stress reduces semiconductor device life.

SUMMARY

In order to reduce the aforementioned stress, connection of a semiconductor device to wiring that does not involve joining with a brazing material such as solder has been under consideration. For example, Japanese Patent Application Laid-open No. H9-252067 (hereinafter, referred to as a patent document 1) discloses a semiconductor module in which a semiconductor device and respective electrode plates are laminated and pressurized in order to connect the semiconductor device and the respective electrode plates to each other. However, with this semiconductor module, a positive plate is arranged on a lower surface of the semiconductor module and a negative plate is arranged on an upper surface of the semiconductor module. Therefore, when installing the semiconductor module to equipment, wirings must be respectively connected to an upper surface side (in other words, a negative plate side) of the semiconductor module and to a lower surface side (in other words, a positive plate side) of the semiconductor module. In other words, complicated wiring is required to install the semiconductor module to the equipment. In consideration thereof, the present description provides a semiconductor module that can be installed to equipment using simpler wiring.

A semiconductor module disclosed in the present description includes a semiconductor device, a first conductive member, a second conductive member, a third conductive member, and an insulating member. The semiconductor device includes a semiconductor substrate, a first electrode formed on one surface of the semiconductor substrate, and a second electrode formed on a surface of the semiconductor substrate opposite to the one surface. The first conductive member is in contact with the first electrode. The second conductive member is in contact with the second electrode. The third conductive member is in contact with the second conductive member and extends along the first conductive member. The insulating member provides insulation between the first conductive member and the third conductive member. The third conductive member is fixed to the first conductive member and the second conductive member by being sandwiched between the first conductive member and the second conductive member. The semiconductor device is fixed to the first conductive member and the second conductive member by being sandwiched between the first conductive member and the second conductive member.

In this semiconductor module, the semiconductor device is fixed to the first conductive member and the second conductive member by being sandwiched between the first conductive member and the second conductive member. In other words, the semiconductor device is fixed by pressure. Since this semiconductor module does not use joining by a brazing material, stress is less likely to be applied to the semiconductor device when heat is being generated by the semiconductor device. The first conductive member is electrically connected to the first electrode of the semiconductor device. In addition, the third conductive member is electrically connected to the second electrode of the semiconductor device via the second conductive member. The third conductive member extends along the first conductive member. Therefore, when installing this semiconductor module to equipment, wirings to the third conductive member and the first conductive member can be provided with ease.

DESCRIPTION OF EMBODIMENTS

The semiconductor module described in this specification may further include a cylinder. The cylinder may be formed of an insulator, encompassing the semiconductor device, and fixed to the first conductive member. A first thread groove may be formed on an outer peripheral surface of the cylinder. In addition, a second thread groove may be formed on the second conductive member, and the second conductive member may be fixed to the cylinder by an engagement of the second thread groove with the first thread groove.

With this semiconductor module, the second conductive member can be fixed to the cylinder by rotating the second conductive member and causing the second thread groove to engage with the first thread groove. In addition, according to such a configuration, by rotating the second conductive member, the semiconductor device and the third conductive member that are located between the second conductive member and the first conductive member can be pressurized and fixed. In other words, by assembling the second conductive member to the cylinder, the second conductive member, the third conductive member, the first conductive member, and the semiconductor device can be fixed to each other. Consequently, this semiconductor module can be assembled with ease. Furthermore, since the third conductive member is a member that is separated from the second conductive member, the second conductive member can be rotated independently from the third conductive member. Therefore, the third conductive member can be readily positioned with respect to the first conductive member.

In the semiconductor module described in this specification, a first engaging portion configured of a concavity or a convexity may be formed on the outer peripheral surface of the cylinder. The third conductive member may include a penetrating hole, a second engaging portion configured of a concavity or a convexity may be formed on an inner surface of the penetrating hole, and the cylinder may be inserted into the penetrating hole of the third conductive member in a state where the first engaging portion engages with the second engaging portion.

According to such a configuration, when rotating the second conductive member, the third conductive member can be prevented from relatively rotating with respect to the first conductive member. Therefore, the third conductive member can be reliably positioned with respect to the first conductive member.

In the semiconductor module described in this specification, a third electrode, through which a smaller current than in the first electrode and the second electrode flows, may be further formed on the one surface of the semiconductor substrate. In addition, the semiconductor module may further include a wiring member connected to the third electrode and penetrating the first conductive member in a state of being insulated from the first conductive member.

According to such a configuration, the wiring member connected to the third electrode can be extended to a side of the first conductive member. Therefore, a wiring to the third electrode can be provided at a position near the first conductive member.

In the semiconductor module described in this specification, a concave portion may be formed on a back surface of the first conductive member which is a surface opposite to a front surface of the first conductive member being in contact with the first electrode. The wiring member may penetrate the first conductive member at a position at which the concave portion is formed and extends along a bottom surface of the concave portion within the concave portion. The wiring member within the concave portion may be covered by an insulator.

According to such a configuration, the wiring member does not protrude from the back surface of the first conductive member. The back surface of the first conductive member can be readily brought into close contact with other equipment. Therefore, according to the present configuration, the semiconductor module can be assembled to the equipment with ease.

In the semiconductor module described in this specification, a part of the back surface of the first conductive member on which the concave portion is not formed and a surface of the insulator within the concave portion may form a consecutive flat plane.

According to such a configuration, the semiconductor module can be assembled to equipment with greater ease.

First Embodiment

Figure 1:
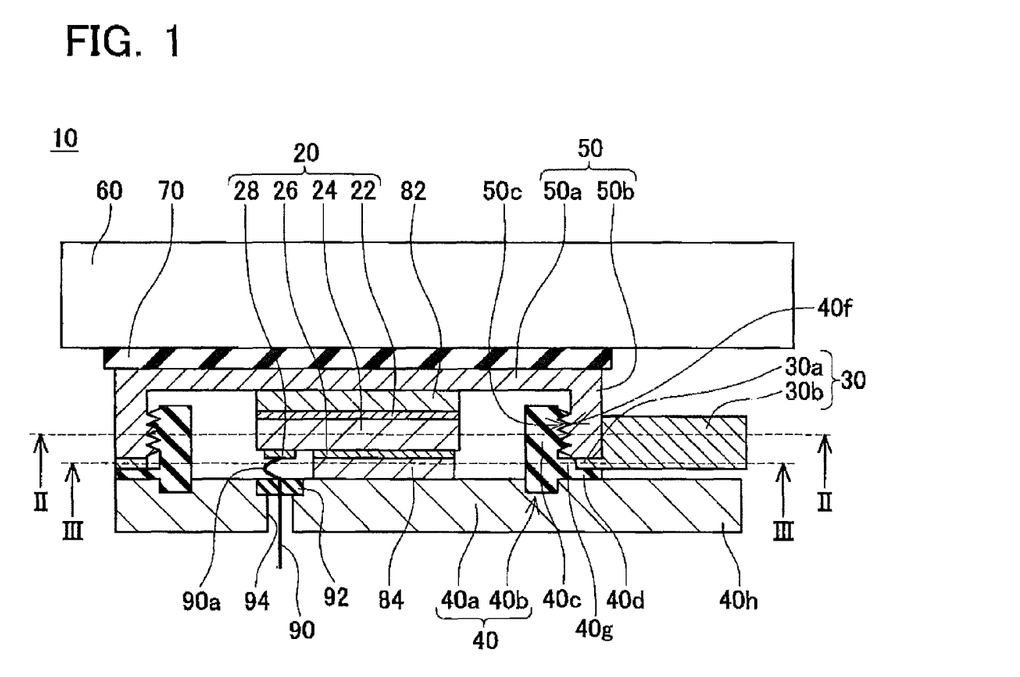
FIG. 1 is a schematic cross-sectional view of a semiconductor module 10 according to a first embodiment.

A semiconductor module 10 shown in FIG. 1 is an assembly in which a semiconductor device 20 is housed in a case 40 and a cover 50.

Figure 2:
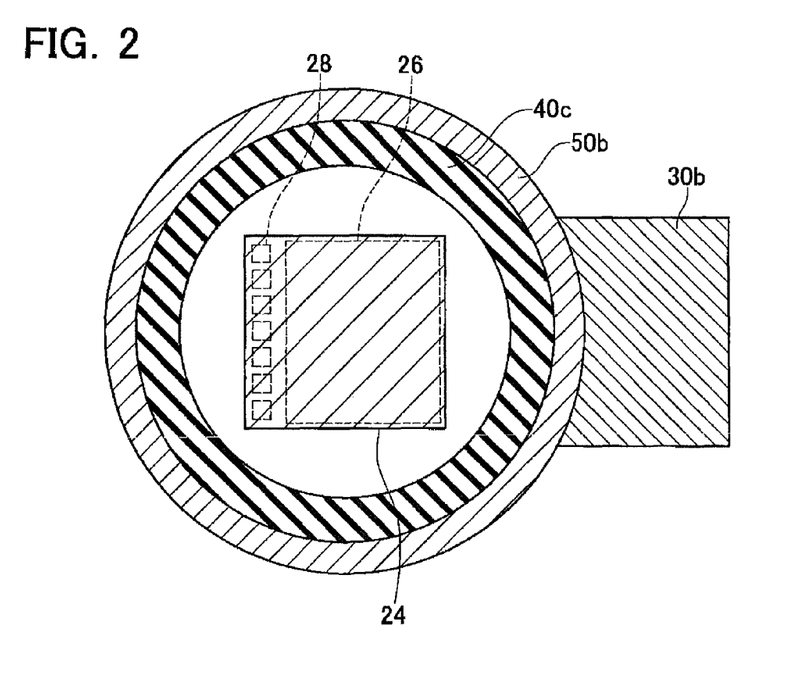
FIG. 2 is a cross-sectional view of the semiconductor module 10 taken along line II-II in FIG. 1.
Figure 3:
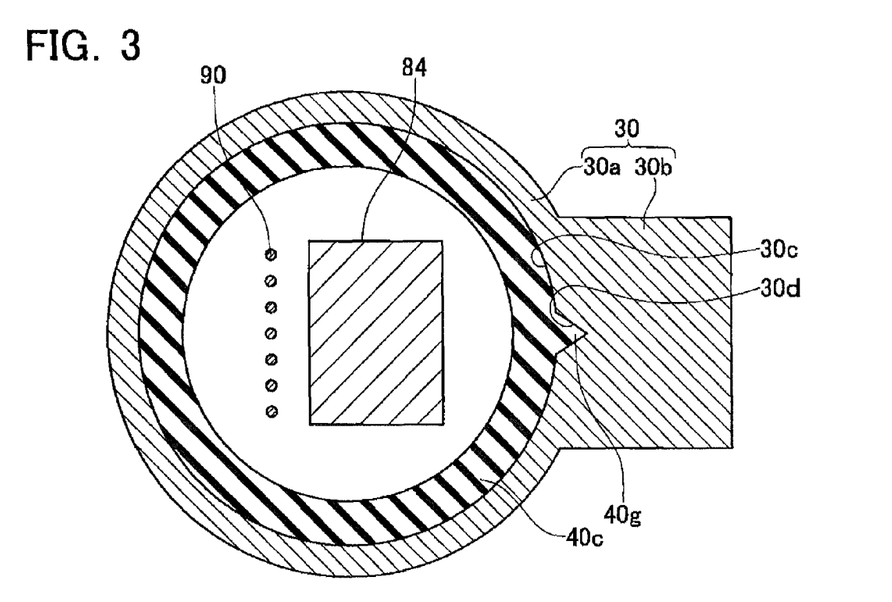
FIG. 3 is a cross-sectional view of the semiconductor module 10 taken along line III-III in FIG. 1.

The case 40 includes an electrode plate 40a formed of metal and an insulating portion 40b formed of an insulator. The electrode plate 40a is formed in an approximately planar shape. The insulating portion 40b is formed of a high-strength engineering plastic such as a phenolic resin. The insulating portion 40b is fixed on the electrode plate 40a. As shown in FIGS. 1 to 3, the insulating portion 40b includes a cylindrical portion 40c and a flange portion 40d. The cylindrical portion 40c is formed in a cylindrical shape with a central axis extending perpendicular to the electrode plate 40a. A thread groove 40f is formed on an outer peripheral surface of the cylindrical portion 40c. A convex portion 40g is formed on a lower side of the thread groove 40f. As shown in FIG. 3, the convex portion 40g is a portion that partially protrudes from an outer peripheral surface of the cylindrical portion 40c. The flange portion 40d is a disk-like portion with a radius that is lager than the outer peripheral surface of the cylindrical portion 40c. The flange portion 40d is formed on a lower side of the convex portion 40g. A part of the electrode plate 40a constitutes an extending portion 40h that extends outward from a portion at which the insulating portion 40b is fixed.

A metal plate 84, the semiconductor device 20, a metal plate 82, and pins 90 are installed on the electrode plate 40a at a position inside the cylindrical portion 40c.

The metal plate 84 is installed on the electrode plate 40a. The metal plate 84 is constructed of a relatively soft metal such as tin.

The semiconductor device 20 is installed on the metal plate 84. The semiconductor device 20 includes a semiconductor substrate 24 constructed of SIC. A MOSFET is formed in the semiconductor substrate 24. A source electrode 26 of the MOSFET and a plurality of gate electrodes 28 of the MOSFET are formed on a lower surface of the semiconductor substrate 24. Dotted lines 26 and 28 in FIG. 2 indicate positions of the source electrode 26 and the gate electrodes 28 on the lower surface of the semiconductor substrate 24. As shown in FIG. 2, the semiconductor substrate 24 has a square shape. The plurality of gate electrodes 28 is arranged along one side of the semiconductor substrate 24. As shown in FIG. 1, a drain electrode 22 of the MOSFET is formed on an upper surface of the semiconductor substrate 24. The semiconductor device 20 is installed on the metal plate 84 so that the source electrode 26 comes into contact with the metal plate 84. The respective gate electrodes 28 are not in contact with the metal plate 84. A current smaller than currents that flow through the source electrode 26 and the drain electrode 22 flows through each gate electrodes 28.

The metal plate 82 is installed on the semiconductor device 20. The metal plate 82 is formed of a relatively soft metal such as tin. The metal plate 82 is in contact with the drain electrode 22 of the semiconductor device 20.

A through hole 94 that penetrates the electrode plate 40a of the case 40 from an upper surface to a lower surface of the electrode plate 40a is formed in the electrode plate 40a at a position opposing the gate electrodes 28 of the semiconductor device 20. The through hole 94 extends along a direction in which the plurality of gate electrodes 28 is arranged. Specifically, a single through hole 94 having an approximately rectangular shape in a plan view is formed in the electrode plate 40a so as to oppose all of the gate electrodes 28. An insulating member 92 is fixed inside the through hole 94. The insulating member 92 is constructed by a resin material such as polyphenylene sulfide (PPS). The through hole 94 is blocked by the insulating member 92. Metallic pins 90 are fixed to the insulating member 92 at a location that opposes the gate electrodes 28. As shown in FIG. 3, a pin 90 is fixed to each position that opposes each gate electrode 28. Each pin 90 penetrates the insulating member 92. Consequently, an upper end of each pin 90 is positioned on an upper side of the electrode plate 40a, and a lower end of each pin 90 is positioned on a lower side of the electrode plate 40a. A portion 90a of each pin 90 on the upper side of the electrode plate 40a is a spring portion that deforms elastically. Each spring portion 90a is in contact with a corresponding gate electrode 28 in a bent state. Each pin 90 is insulated from the electrode plate 40a of the case 40 by the insulating member 92.

The cover 50 is constructed of metal. An insulation coating is applied to an outer surface of the cover 50. The cover 50 includes a side wall portion 50b having a cylindrical shape and a flat plate portion 50a that blocks one end of a central hole of the side wall portion 50b. In other words, the cover 50 is shaped like a cup. A thread groove 50c is formed on an inner peripheral surface of the side wall portion 50b. The thread groove 50c of the cover 50 engages with the thread groove 40f of the case 40. In other words, the cover 50 is fastened to the case 40 using the thread grooves 40f and 50c. A lower surface of the flat plate portion 50a of the cover 50 is in contact with the metal plate 82. More specifically, the flat plate portion 50a of the cover 50 and the electrode plate 40a of the case 40 sandwich a laminated body constituted by the metal plate 84, the semiconductor device 20, and the metal plate 82. The cover 50 is fastened at a high torque to the case 40. As a result, the laminated body is pressurized by the flat plate portion 50a and the electrode plate 40a. Due to the pressure, respective members constituting the laminated body are fixed. Moreover, a contact portion of the electrode plate 40a of the case 40 and the metal plate 84, a contact portion of the metal plate 84 and the source electrode 26 of the semiconductor device 20, a contact portion of the drain electrode 22 of the semiconductor device 20 and the metal plate 82, a contact portion of the metal plate 82 and the flat plate portion 50a of the cover 50, and a contact portion of the pin 90 and the gate electrode 28 of the semiconductor device 20 are not joined by a brazing material such as solder. Therefore, if the cover 50 is detached from the case 40, the respective members of the laminated body can be separated from each other.

In addition, the semiconductor module 10 includes a bus bar 30. The bus bar 30 is formed of metal. The bus bar 30 includes a ring portion 30a and a plate portion 30b that extend outward from the ring portion 30a. The ring portion 30a is thinner than the plate portion 30b. As shown in FIG. 3, a concave portion 30d is formed on an inner surface of a central hole 30c of the ring portion 30a. The cylindrical portion 40c of the case 40 is inserted into the central hole 30c of the ring portion 30a. The concave portion 30d of the ring portion 30a is engaged with the convex portion 40g of the cylindrical portion 40c. The plate portion 30b extends approximately parallel to the extending portion 40h of the electrode plate 40a at an interval from the extending portion 40h. An upper surface of the ring portion 30a is in contact with a lower end of a side wall portion 50b of the cover 50. A lower surface of the ring portion 30a is in contact with the flange portion 40d of the case 40. The ring portion 30a is sandwiched from above and below by the cover 50 and the case 40. As described above, the cover 50 is fastened at a high torque to the case 40. Therefore, the ring portion 30a is pressurized by the cover 50 and the case 40. Due to the pressure, the bus bar 30 is fixed to the cover 50 and the case 40. The bus bar 30 is insulated from the electrode plate 40a by the flange portion 40d.

An insulating sheet 70 is installed on an upper surface of the flat plate portion 50a of the cover 50. A cooler 60 is installed on an upper surface of the insulating sheet 70. The cooler 60 is a liquid circulation-type cooler. Moreover, grease is applied to a contact portion of the cover 50 and the insulating sheet 70 and to a contact portion of the insulating sheet 70 and the cooler 60. Consequently, thermal resistance between the cooler 60 and the cover 50 is reduced.

As described above, in the semiconductor module 10, a wiring to the source electrode 26 positioned on a lower surface side of the semiconductor substrate 24 is constituted by the electrode plate 40a of the case 40. In addition, a wiring to a drain electrode 22 positioned on an upper surface side of the semiconductor substrate 24 is constituted by the bus bar 30. The bus bar 30 is connected to a side surface of the case 40 and extends approximately parallel to the electrode plate 40a. In this manner, since the electrode plate 40a and the bus bar 30 are arranged close to each other, external wirings thereto can be readily installed. Furthermore, by arranging the electrode plate 40a and the bus bar 30 close to and approximately parallel to each other, an inductance between the electrode plate 40a and the bus bar 30 can be reduced. In particular, since the bus bar 30 is an approximately flat plate-like member, an interval between the bus bar 30 and the electrode plate 40a can be accurately controlled by a thickness of the flange portion 40d. Therefore, the interval between the bus bar 30 and the electrode plate 40a can be further reduced. As a result, in the semiconductor module 10, the inductance between the electrode plate 40a and the bus bar 30 is extremely low.

Furthermore, the pins 90 that are wirings to the gate electrodes 28 penetrate the electrode plate 40a of the case 40 and extend to the lower side of the electrode plate 40a. As a result, wirings are not installed on an upper surface of the cover 50. Since no wirings are located on the upper surface of the cover 50, an entirety of the upper surface of the cover 50 can be connected to a cooler 60 via an insulating sheet 70. Consequently, the semiconductor device 20 can be cooled by the cooler 60 in a preferable manner.

Furthermore, in the semiconductor module 10, the semiconductor device 20 is fixed by pressure, and the semiconductor device 20 and the peripheral members thereof are not joined with each other by brazing or the like. Therefore, when the semiconductor device 20 and the peripheral members thereof thermally expand due to heat generated by the semiconductor device 20, stress is less likely to act on the semiconductor device 20. Consequently, the semiconductor module 10 has a long life.

In addition, in the semiconductor module 10, the cover 50 itself functions as a part of the wiring to the drain electrode 22. Therefore, by simply bringing the bus bar 30 into contact with the cover 50, the bus bar 30 and the drain electrode 22 can be electrically connected to each other. In a hypothetical case of a structure in which the bus bar penetrates the cover 50 and the electrode plate 40a and then connects to the drain electrode 22, penetrating holes must be formed at the cover 50 and the electrode plate 40a, a structure of a semiconductor module must becomes more complex, and a size of the semiconductor module must be increased in order to secure space for the penetrating holes. In addition, since a length of wirings in the semiconductor module increases, an inductance of the wirings also increases. Such problems do not occur with the semiconductor module 10 according to the first embodiment. As a result, the semiconductor module 10 with a small size and a low inductance can be provided.

Next, a method of manufacturing the semiconductor module 10 will be described. First, the case 40 is prepared, and the metal plate 84 is placed on the electrode plate 40a inside the cylindrical portion 40c. A component that integrates the plurality of pins 90, and the insulating member 92 is then installed in the penetrating hole 94 of the electrode plate 40a. Next, the semiconductor device 20 is placed on the metal plate 84. In doing so, the source electrode 26 is brought into contact with the metal plate 84, and the respective gate electrodes 28 are brought into contact with corresponding pins 90. The metal plate 82 is then placed on the semiconductor device 20. Next, the bus bar 30 is installed on the case 40 so that the ring portion 30a is placed on the flange portion 40d. Then, by causing the thread groove 50c of the cover 50 to engage with the thread groove 40f of the case 40, the cover 50 is fixed to the case 40. When the cover 50 is moved downward by rotating the cover 50 around a central axis thereof, the flat plate portion 50a of the cover 50 comes into contact with the metal plate 82. In addition, a lower end of the side wall portion 50b of the cover 50 comes into contact with the ring portion 30a of the bus bar 30. By further rotating the cover 50 from this state, the flat plate portion 50a of the cover 50 pressurizes the metal plate 82 toward the semiconductor device 20. More specifically, a laminated body sandwiched between the flat plate portion 50a of the cover 50 and the electrode plate 40a of the case 40 (in other words, the metal plate 84, the semiconductor device 20, and the metal plate 82) is pressurized in a direction of lamination of the laminated body. Accordingly, respective members of the laminated body are fixed to the case 40 and to the cover 50. At the same time, the side wall portion 50b of the cover 50 pressurizes the ring portion 30a of the bus bar 30 toward the flange portion 40d. In other words, the ring portion 30a sandwiched between the side wall portion 50b and the flange portion 40d is pressurized. Accordingly, the bus bar 30 is fixed to the case 40 and to the cover 50.

Moreover, the metal plate 84 is softer than the source electrode 26 and the electrode plate 40a of the case 40 that are adjacent to the metal plate 84. Therefore, when the laminated body is pressurized, an upper surface of the metal plate 84 plastically deforms so as to conform to a surface shape of the source electrode 26 and the metal plate 84 comes into close contact with the source electrode 26. In a similar manner, when the laminated body is pressurized, a lower surface of the metal plate 84 plastically deforms so as to conform to a surface shape of the electrode plate 40a and the metal plate 84 comes into close contact with the electrode plate 40a. As a result, the source electrode 26 and the electrode plate 40a are electrically connected with each other securely.

In addition, the metal plate 82 is softer than the drain electrode 22 and the cover 50 that are adjacent to the metal plate 82. Therefore, when the laminated body is pressurized, a lower surface of the metal plate 82 plastically deforms so as to conform to a surface shape of the drain electrode 22 and the metal plate 82 comes into close contact with the drain electrode 22. In a similar manner, when the laminated body is pressurized, an upper surface of the metal plate 82 plastically deforms so as to conform to a surface shape of the cover 50 and the metal plate 82 comes into close contact with the cover 50. As a result, the drain electrode 22 and the cover 50 are electrically connected with each other securely.

Furthermore, when the laminated body is pressurized, the spring portions 90a of the pins 90 deflect. As a result, an appropriate pressure is applied between the pins 90 and the gate electrodes 28 and the pins 90 and the gate electrodes 28 are electrically connected with each other securely.

Once the cover 50 is fixed to the case 40, the cooler 60 is attached to the cover 50 via the insulating sheet 70, whereby the semiconductor module 10 shown in FIG. 1 is completed.

In the semiconductor module 10, no wiring to the semiconductor device 20 penetrates the cover 50. Therefore, the cover 50 can be freely rotated during assembly. As a result, the cover 50 can be attached to the case 40 by causing the thread groove 40f and the thread groove 50c to engage each other. In addition, because of this screw structure, the cover 50 can pressurize and fix the laminated body and the bus bar 30. Consequently, the semiconductor module 10 can be assembled with ease.

Furthermore, in the semiconductor module 10, the bus bar 30 is constituted by a component that differs from the cover 50. Furthermore, upon assembly of the semiconductor module 10, when the cylindrical portion 40c is inserted into the central hole 30c of the ring portion 30a of the bus bar 30, the concave portion 30d of the bus bar 30 engages with the convex portion 40g of the cylindrical portion 40c. Accordingly, the bus bar 30 is no longer capable of relative rotation with respect to the case 40. As a result, when rotating the cover 50 to fasten the cover 50 to the case 40, relative positions of the bus bar 30 and the case 40 remain unchanged. Accordingly, a displacement of the bus bar 30 and the case 40 is prevented. Therefore, the bus bar 30 can be readily fixed to a position opposing the extending portion 40h of the electrode plate 40a.

Moreover, the semiconductor module 10 according to the first embodiment corresponds to respective components set forth in the claims as follows. The electrode plate 40a of the case 40 and the metal plate 84 constitute a first conductive member according to the claims. The cover 50 and the metal plate 82 constitute a second conductive member according to the claims. The bus bar 30 constitutes a third conductive member according to the claims. The flange portion 40d of the case 40 constitutes an insulating member according to the claims. The cylindrical portion 40c of the case 40 constitutes a cylinder according to the claims.

In the first embodiment, the concave portion 30d is formed on the bus bar 30 and the convex portion 40g is formed on the cylindrical portion 40c, whereby the concave portion 30d and the convex portion 40g engage with each other. Alternatively, a convex portion may be formed on the bus bar 30 and a concave portion may be formed on the cylindrical portion 40c, whereby the convex portion and the concave portion may engage with each other.

In addition, while the semiconductor module 10 according to the first embodiment includes the metal plate 84, alternatively, the metal plate 84 may be absent and the source electrode 26 may come into direct contact with the electrode plate 40a. Furthermore, while the semiconductor module 10 according to the first embodiment includes the metal plate 82, alternatively, the metal plate 82 may be absent and the drain electrode 22 may come into direct contact with the case 40.

Next, a semiconductor module according to a modification of the semiconductor module 10 according to the first embodiment will be described. Moreover, in the following description of respective semiconductor modules according to modifications, members configured similarly to those of the first embodiment are denoted by the same reference numbers as in the first embodiment.

Figure 4:
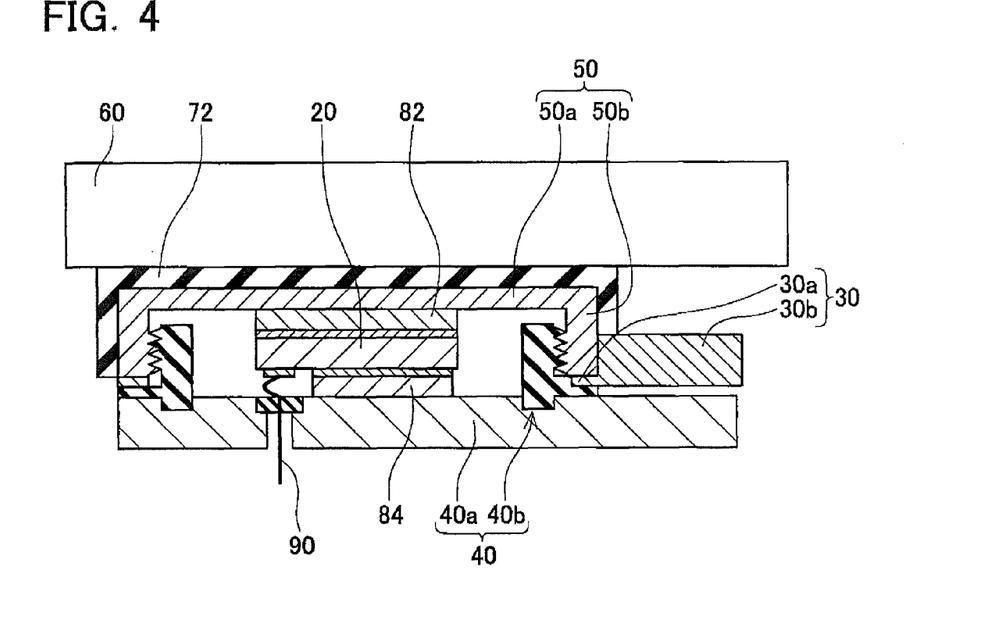
FIG. 4 is a schematic cross-sectional view of a semiconductor module according to a first modification.

In the first embodiment, the cover 50 is fixed to the cooler 60 via the insulating sheet 70. Alternatively, an insulating film may be formed on a surface of the cover 50 and the cover 50 may be fixed to the cooler 60 via the insulating film. Furthermore, as shown in FIG. 4, an insulating cap 72 may be overlaid on the cover 50 and the cover 50 may be fixed to the cooler 60 via the cap 72.

Figure 5:
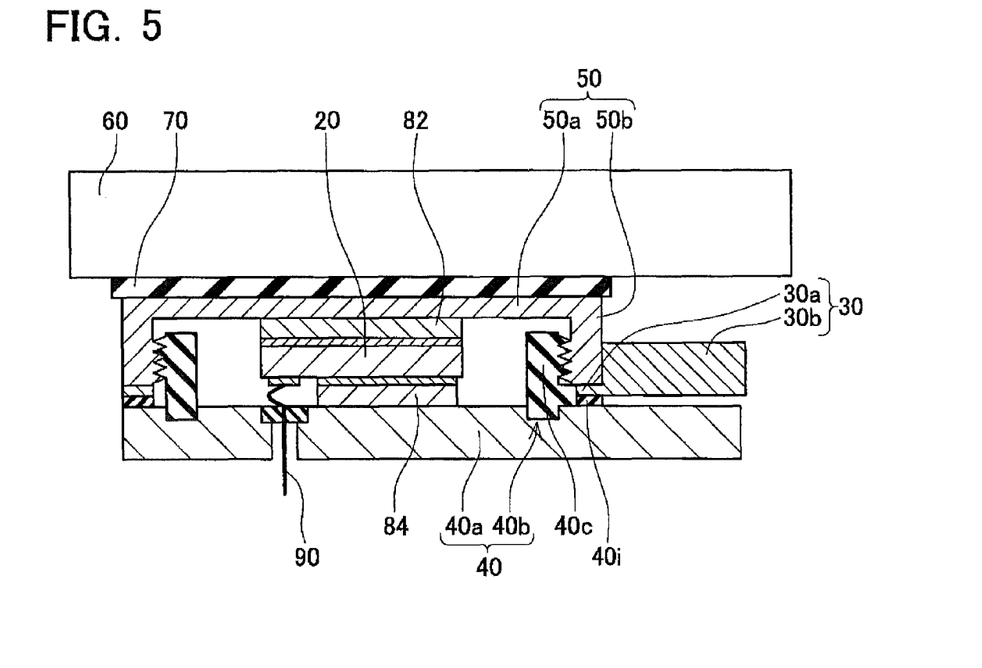
FIG. 5 is a schematic cross-sectional view of a semiconductor module according to a second modification.

In addition, in the first embodiment, the flange portion 40d that is integrated with the cylindrical portion 40c is arranged under the bus bar 30. Alternatively, as shown in FIG. 5, an insulator 40i arranged under the bus bar 30 may be separated from the cylindrical portion 40c. In this case, the insulator 40i is a ring-like member and is arranged so as to overlap the ring portion 30a of the bus bar 30. The insulator 40i and the ring portion 30a are sandwiched between the case 40 and the cover 50 in a laminated state. The bus bar 30 and the insulator 40*i* are fixed by being pressurized by the case 40 and the cover 50.

Figure 6:
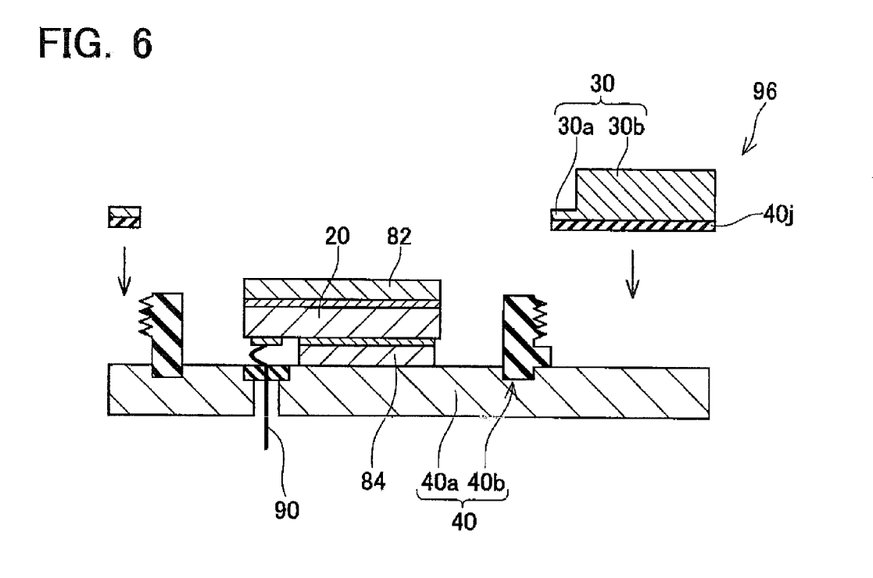
FIG. 6 is a schematic cross-sectional view showing a method of assembling a semiconductor module according to a third modification.

Alternatively, as shown in FIG. 6, a component 96 in which an insulating layer 40*j* is formed on a lower surface of the bus bar 30 may be prepared and installed on the electrode plate 40*a*. Even with such a configuration, the bus bar 30 can be insulated from the electrode plate 40*a*.

Figure 7:
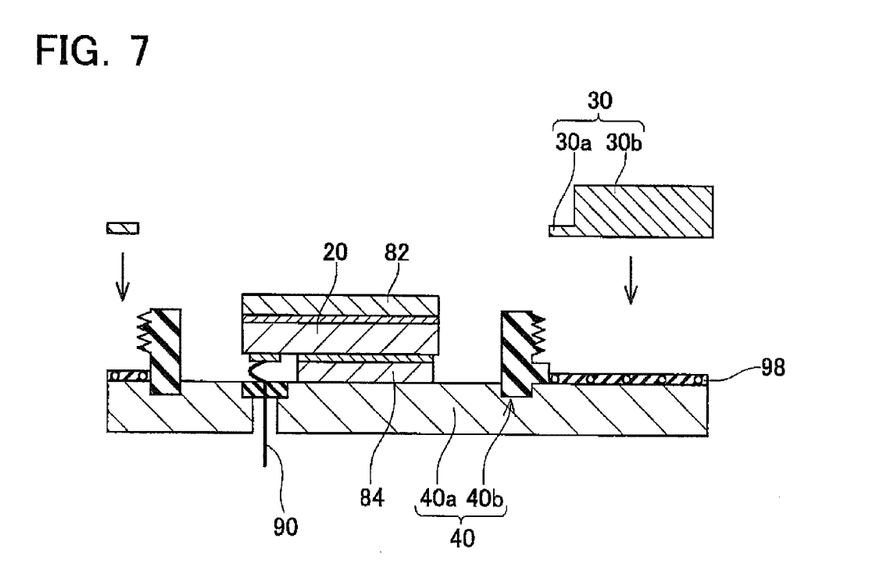
FIG. 7 is a schematic cross-sectional view showing a method of assembling a semiconductor module according to a fourth modification.

Alternatively, as shown in FIG. 7, a flowable resin 98 containing particles with a certain diameter may be applied on the electrode plate 40*a*, and the bus bar 30 may be arranged on the resin 98. Even in this case, an interval between the bus bar 30 and the electrode plate 40*a* is secured by the particles in the resin 98. The resin 98 may or may not be hardened after installing the bus bar 30.

Second Embodiment

Figure 8:
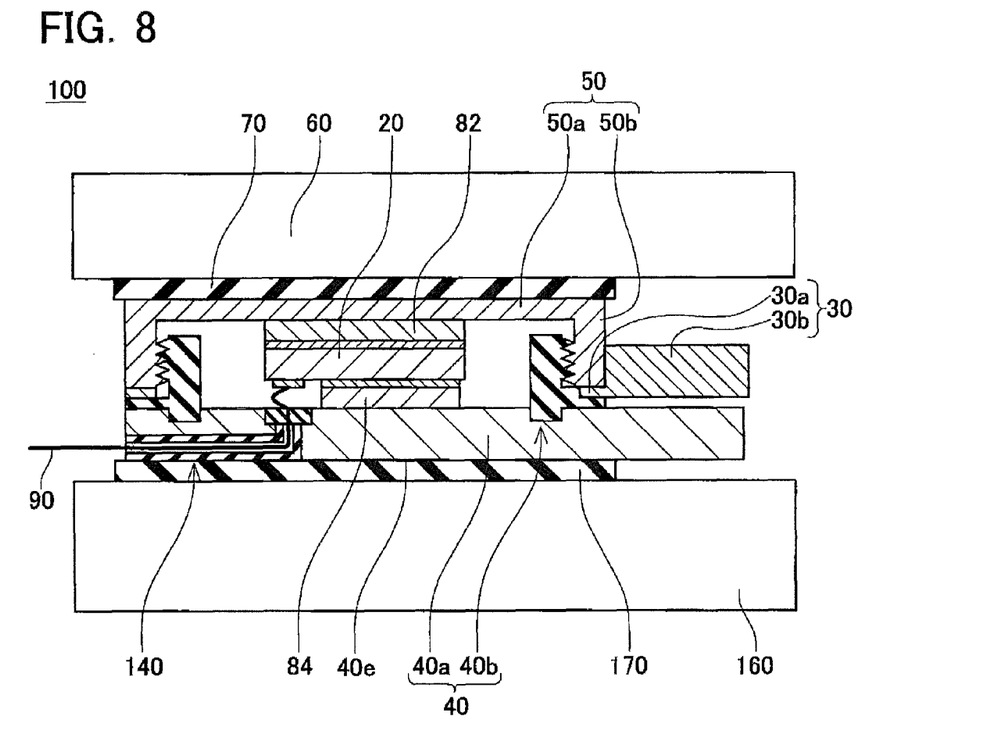
FIG. 8 is a schematic cross-sectional view of a semiconductor module 100 according to a second embodiment.

Next, a semiconductor module 100 according to a second embodiment shown in FIG. 8 will be described. The semiconductor module 100 according to the second embodiment shares the same configuration as the semiconductor module 10 according to the first embodiment with the exception of the electrode plate 40*a* and the pin 90. Moreover, in the following description of the semiconductor module 100 according to the second embodiment, members corresponding to the respective members constituting the semiconductor module 10 according to the first embodiment are denoted by the same reference numbers as in the first embodiment.

Figure 9:
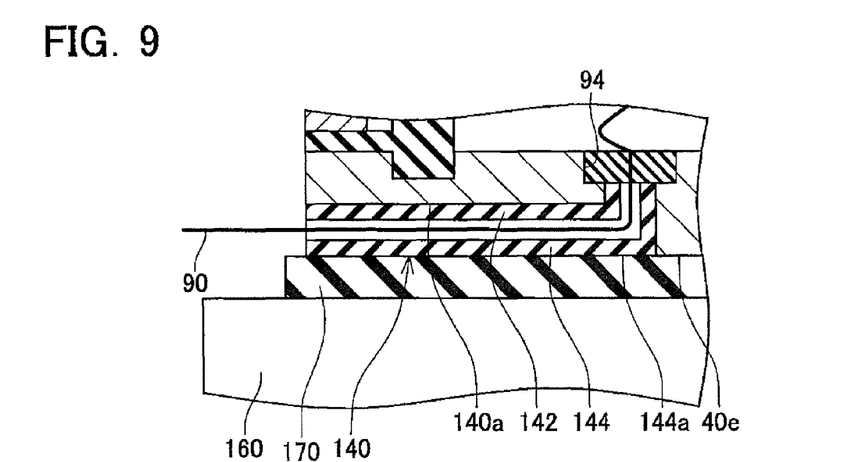
FIG. 9 is an enlarged cross-sectional view of a concave portion 140.

In the semiconductor module 100 according to the second embodiment, a concave portion 140 is formed on a lower surface of the electrode plate 40*a*. FIG. 9 is an enlarged cross-sectional view of a vicinity of the concave portion 140. A bottom surface 140*a* of the concave portion 140 is positioned on an upper side relative to a back surface 40*e* of the electrode plate 40*a* other than the concave portion 140. A penetrating hole 94 formed on the electrode plate 40*a* is opened to the bottom surface 140*a* of the concave portion 140. The pin 90 is bent within the concave portion 140. The pin 90 within the concave portion 140 extends approximately parallel to the bottom surface 140*a* of the concave portion 140. Two insulating members 142 and 144 are arranged within the concave portion 140. The insulating member 142 is arranged between the pin 90 and the electrode plate 40*a* and insulates the pin 90 from the electrode plate 40*a*. The insulating member 144 is arranged on a lower side of the pin 90. A gap is formed between the insulating member 142 and the insulating member 144, and the pin 90 extends along the gap. A surface 144*a* of the insulating member 144 is a flat plane. The surface 144*a* of the insulating member 144 is positioned at approximately a same height as the back surface 40*e* of the electrode plate 40*a* other than the concave portion 140. As a result, a consecutive flat plane is formed by the surface 144*a* and the back surface 40*e*.

An insulating sheet 170 is installed on a lower surface of the case 40 (in other words, the surface 144*a* and the back surface 40*e*). A cooler 160 is installed on a lower surface of the insulating sheet 170. With the semiconductor module 100 according to the second embodiment, a semiconductor device 20 can be cooled not only by an upper surface side cooler 60 but also by the lower surface side cooler 160.

As described above, in the semiconductor module 100 according to the second embodiment, the pin 90 penetrating the electrode plate 40*a* is bent and housed within the concave portion 140. Since the pin 90 is a wiring through which a small current flows, the pin 90 has a small diameter. Therefore, the pin 90 can be bent easily and housed within the concave portion 140 in a preferable manner. By housing the pin 90 within the concave portion 140 as described above, the lower surface of the case 40 (the surface 144*a* and the back surface 40*e*) can be formed flat. Since the lower surface of the case 40 is formed flat, an entirety of the lower surface of the case 40 can be connected to the cooler 160 via the insulating sheet 170. Consequently, the semiconductor device 20 can be cooled by the cooler 160 in an efficient manner. With the semiconductor module 100, a rise in temperature of the semiconductor device 20 can be better suppressed using the two coolers 60 and 160.

Moreover, the semiconductor module 100 according to the second embodiment can be assembled as follows. First, using the electrode plate 40*a* on which the concave portion 140 is formed, a same operation as in the first embodiment is performed. The insulating member 142 is then installed within the concave portion 140. Next, the pin 90 is bent. The insulating member 144 is then installed within the concave portion 140 so that the surface 144*a* of the insulating member 144 and the back surface 40*e* of the electrode plate 40*a* are flat. Subsequently, by mounting the insulating sheet 170 and the cooler 160, the semiconductor module 100 shown in FIG. 8 is completed.

Third Embodiment

Figure 10:
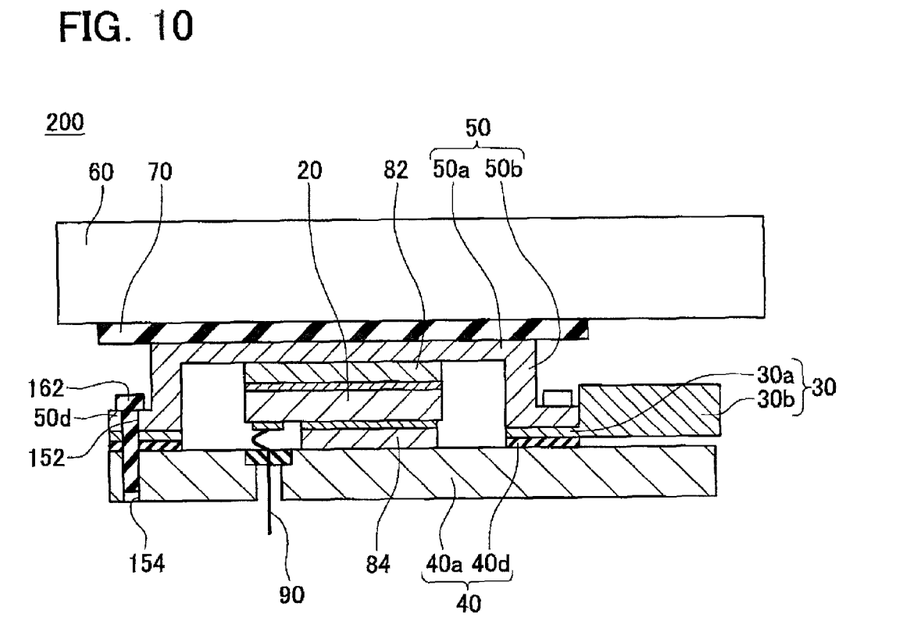
FIG. 10 is a schematic cross-sectional view of a semiconductor module 200 according to a third embodiment.

Next, a semiconductor module 200 according to a third embodiment shown in FIG. 10 will be described. The semiconductor module 200 according to the third embodiment shares a same configuration as the semiconductor module 10 according to the first embodiment with the exception of the cover 50 and the case 40. Moreover, in the following description of the semiconductor module 200 according to the third embodiment, members corresponding to the respective members constituting the semiconductor module 10 according to the first embodiment are denoted by the same reference numbers as in the first embodiment.

In the semiconductor module 200 according to the third embodiment, the case 40 does not include a cylindrical portion. In other words, the case 40 is constituted by an electrode plate 40*a* and an insulator 40*d* (a portion corresponding to the flange portion 40*d* according to the first embodiment).

In the semiconductor module 200 according to the third embodiment, a flange portion 50*d* is formed at a lower end of a side wall portion 50*b* of the cover 50.

Formed on the flange portion 50*d* of the cover 50, the bus bar 30, and the insulator 40*d* are penetrating holes 152 that penetrate the flange portion 50*d*, the bus bar 30, and the insulator 40*d*. Although not shown, the penetrating hole 152 is formed at three locations. In addition, screw holes 154 are formed on the electrode plate 40*a* at three locations corresponding to the penetrating holes 152.

Screws 162 are fastened to the screw holes 154 through the penetrating holes 152. The cover 50 is fixed to the case 40 by three screws 162. The metal plate 82, the semiconductor device 20, and the metal plate 84 are fixed by being sandwiched between the cover 50 and the case 40. In addition, the bus bar 30 is fixed by being sandwiched between the cover 50 and the case 40. Moreover, the three screws 162 are formed of an insulator. Therefore, the cover 50 is insulated from the electrode plate 40*a*.

As described above, even with a configuration according to the third embodiment, the semiconductor device 20 and the bus bar 30 can be fixed by pressurization created by fastening the screws 162.

Moreover, while a MOSFET has been described as the semiconductor devices according to the embodiments shown above, configurations of the embodiments described above are applicable to various semiconductor devices such as an i and a diode.

In addition, in the embodiments described above, the pin 90 is a wiring to the gate electrode 28. Alternatively, the pin 90 may be another wiring. For example, the pin 90 may be wiring for detecting a current that flows through the semiconductor device 20 (such as a wiring through which flows a current having a certain ratio to a current flowing through a source electrode 26) or a wiring for measuring a temperature of the semiconductor device 20 (such as a wiring through which flows a current that varies according to the temperature of the semiconductor device 20).

While preferred embodiments of the present disclosure have been described using specific terms, such description is for illustrative purposes only and is not intended to limit the scope of the following claims. The techniques described in the claims include various modifications and changes made to the specific embodiments illustrated above. The technical elements described in this description or in the drawings exhibit technical utility singly or in various combinations and are not limited to the combinations recited in the claims as filed. Moreover, the techniques illustrated in this description or in the drawings simultaneously attain a plurality of purposes, and attaining one of the purposes per se offers technical utility.

The invention claimed is:

1. A semiconductor module, comprising:
a semiconductor device comprising:
   a semiconductor substrate,
   a first electrode formed on one surface of the semiconductor substrate, and
   a second electrode formed on a surface of the semiconductor substrate opposite to the one surface;
a first conductive member being in contact with the first electrode;
a second conductive member being in contact with the second electrode;
a third conductive member being in contact with the second conductive member and extending along the first conductive member; and
an insulating member insulating between the first conductive member and the third conductive member,
wherein
the third conductive member is fixed to the first conductive member and the second conductive member by being sandwiched between the first conductive member and the second conductive member and extends to outer side of the second conductive member,
the semiconductor module further comprises a cylinder formed of an insulator, encompassing the semiconductor device, fixed to the first conductive member, and having a first thread groove formed on an outer peripheral surface thereof, the semiconductor device is fixed to the first conductive member and the second conductive member by being sandwiched between the first conductive member and the second conductive member and is disposed at a position inside the cylinder, and
a second thread groove is formed on the second conductive member, and the second conductive member is fixed to the cylinder by an engagement of the first thread groove and the second thread groove.

2. A semiconductor module of claim 1, wherein
a first engaging portion including at least one of a concavity or a convexity is formed on the outer peripheral surface of the cylinder,
the third conductive member comprises a penetrating hole,
a second engaging portion including at least one of a concavity or a convexity is formed on an inner surface of the penetrating hole, and
the cylinder is inserted into the penetrating hole of the third conductive member in a state where the first engaging portion engages with the second engaging portion.

3. A semiconductor module of claim 1,
the semiconductor device further comprising a third electrode formed on the one surface of the semiconductor substrate, and through which a smaller current than in the first electrode and the second electrode flows, and
the semiconductor module further comprising a wiring member connected to the third electrode and penetrating the first conductive member in a state of being insulated from the first conductive member.

4. A semiconductor module of claim 3, wherein
a concave portion is formed on a back surface of the first conductive member which is a surface opposite to a front surface of the first conductive member being in contact with the first electrode,
the wiring member penetrates the first conductive member at a position at which the concave portion is formed and extends along a bottom surface of the concave portion within the concave portion, and
the wiring member within the concave portion is covered with an insulator.

5. A semiconductor module of claim 4, wherein
a part of the back surface of the first conductive member on which the concave portion is not formed and a surface of the insulator within the concave portion form a consecutive flat plane.

6. A semiconductor module of claim 1, wherein
the insulating member is directly connected to the cylinder and is directly sandwiched by the first conducting member and the third conducting member,
the third conducting member is directly sandwiched by the insulating member and the second conducting member.

* * * * *

UNITED STATES PATENT AND TRADEMARK OFFICE
CERTIFICATE OF CORRECTION

| | | |
|---|---|---|
| PATENT NO. | : 8,786,107 B2 | Page 1 of 1 |
| APPLICATION NO. | : 13/613646 | |
| DATED | : July 22, 2014 | |
| INVENTOR(S) | : Norimune Orimoto | |

It is certified that error appears in the above-identified patent and that said Letters Patent is hereby corrected as shown below:

In the Specification

At column 4, line 30, change "constructed of SIC" to -- constructed of SiC --.

At column 11, line 2, change "such as an i" to -- such as IGBT --.

Signed and Sealed this
Fourteenth Day of April, 2015

Michelle K. Lee
*Director of the United States Patent and Trademark Office*